(12) United States Patent
Yu et al.

(10) Patent No.: US 9,075,313 B2
(45) Date of Patent: Jul. 7, 2015

(54) MULTIPLE EXPOSURES IN EXTREME ULTRAVIOLET LITHOGRAPHY

(71) Applicant: Taiwan Semiconductor Manufacturing Company, Ltd., Hsin-Chu (TW)

(72) Inventors: Shinn-Sheng Yu, Hsinchu (TW); Anthony Yen, Zhubei (TW); Yen-Cheng Lu, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 24 days.

(21) Appl. No.: 13/910,925

(22) Filed: Jun. 5, 2013

(65) Prior Publication Data

US 2014/0272720 A1 Sep. 18, 2014

Related U.S. Application Data

(60) Provisional application No. 61/778,665, filed on Mar. 13, 2013.

(51) Int. Cl.
G03F 7/20 (2006.01)

(52) U.S. Cl.
CPC ............ *G03F 7/2022* (2013.01); *G03F 7/2004* (2013.01)

(58) Field of Classification Search
CPC ....... G03F 7/20; G03F 7/2004; G03F 7/2022; G03F 7/213

USPC .......................................... 430/311, 322, 394
See application file for complete search history.

(56) References Cited

U.S. PATENT DOCUMENTS

| | | | |
|---|---|---|---|
| 2003/0123039 A1* | 7/2003 | Yen et al. ......................... | 355/68 |
| 2008/0268381 A1* | 10/2008 | Saito et al. ..................... | 430/323 |
| 2009/0274981 A1 | 11/2009 | Griebenow et al. | |
| 2013/0198697 A1* | 8/2013 | Hotzel ............................ | 716/51 |

* cited by examiner

*Primary Examiner* — Kathleen Duda
(74) *Attorney, Agent, or Firm* — Haynes and Boone, LLP

(57) ABSTRACT

An extreme ultraviolet lithography method is disclosed. In an example, the EUVL method comprises providing at least two mask areas having a same pattern, forming a resist layer over a substrate, determining an optimized exposure dose based on an exposure dose for a pre-specified pattern on one of the at least two mask areas to achieve a pre-specified target dimension under a corresponding single exposure process, and performing a multiple exposure process for exposing a same area of the resist layer to the same pattern. The multiple exposure process comprises a plurality of exposure processes, wherein each of the plurality of exposure processes uses an exposure dose that is less than the optimized exposure dose and a sum of the exposure dose of each of the plurality of exposure processes is approximately equal to the optimized exposure dose.

20 Claims, 13 Drawing Sheets

MULTIPLE EXPOSURES IN EXTREME ULTRAVIOLET LITHOGRAPHY

PRIORITY DATA

This patent is a non-provisional patent application of U.S. Ser. No. 61/778,665 filed Mar. 13, 2013, the entire disclosure of which is hereby incorporated by reference.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of processing and manufacturing ICs and, for these advances to be realized, similar developments in IC processing and manufacturing are needed. For example, higher resolution lithography processes, such as extreme ultraviolet (EUV) lithography processes, are implemented to meet size constraints approaching critical dimension tolerances of 32 nm technology nodes and below. EUV lithography uses a reflective mask (also referred to as a reticle) to transfer a pattern of a layer of an integrated circuit device to a wafer. A reflective mask typically includes a reflective multilayer coating (multi-layered mirror stack) disposed on a substrate. Any defects, including microscopic defects, in the substrate cause disturbances (or deformations) in material layers of the reflective multilayer coating that undesirably affect printability of the pattern of the reflective mask. Such defects are often difficult to inspect and, even if detected, difficult to repair. Accordingly, although existing EUV masks and methods of manufacturing EUV masks have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
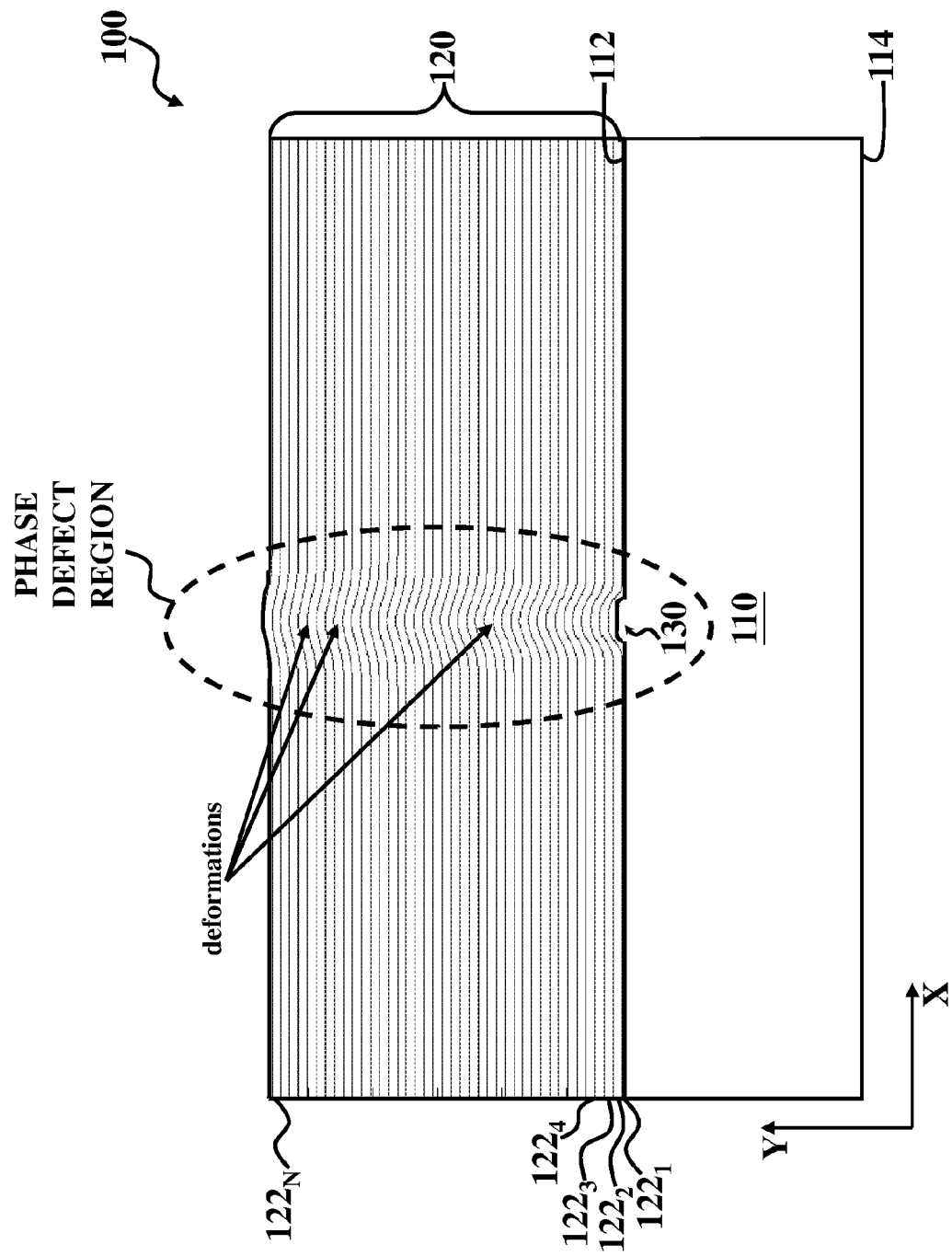
FIG. 1 is a diagrammatic cross-sectional side view of a mask according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a diagrammatic cross-sectional side view of a mask 100 (also referred to as a photomask or a reticle) according to various aspects of the present disclosure. In the depicted embodiment, the mask 100 is a mask blank that will undergo a mask fabrication process to pattern the mask blank with a design of a layer of an integrated circuit (IC) device, such that the mask 100 can be used during IC device fabrication. FIG. 1 has been simplified for the sake of clarity to better understand the inventive concepts of the present disclosure. Additional features can be added in the mask 100, and some of the features described below can be replaced or eliminated for additional embodiments of the mask 100.

The mask 100 includes a substrate 110. The substrate 110 has a surface 112 and a surface 114 that is opposite the surface 112. In the present example, the substrate 110 includes a low thermal expansion material (LTEM). In an example, the LTEM substrate includes titania ($TiO_2$) doped fused silica ($SiO_2$). Alternatively, the substrate 110 includes other materials, such as quartz or glass, depending on design requirements of the mask 100.

A reflective multilayer coating (RMLC) 120 (also referred to as a multilayer mirror (MLM)) is deposited over the substrate 110, particularly over a surface 112 of the substrate 110. The RMLC 120 includes multiple material layers $122_1, 122_2, 122_3, 122_4, \ldots, 122_N$, where N is a total number of the material layers of the RMLC 120. Hereafter, for ease of discussion, "a material layer" or "material layers" is simply referred to as "a layer" or "layers." In the present example, in relation to the surface 112 of the substrate 110, the layer $122_1$ may be referred to as a bottommost layer of the RMLC 120, and the layer $122_N$ may be referred to as the topmost layer of the RMLC 120. In furtherance of the present example, the multiple layers 122$_1$, 122$_2$, 122$_3$, 122$_4$, ..., 122$_N$ form a number of layer pairs, where each layer pair includes two layers having different refractive indices (in other words, a combination of a first material and a second material, where a refractive index of the first material is different than a refractive index of the second material). For example, a layer pair includes layer 122$_1$ and layer 122$_2$, another layer pair includes layer 122$_3$ and layer 122$_4$, and so forth. The combination of the materials in the layer pair is selected to provide a large difference in refractive indices between the two layers (for example, to achieve large reflectivity at an interface of the two layers according to Fresnel equations), yet provide small extinction coefficients for the layers (for example, to minimize absorption). In an example, the RMLC 120 includes molybdenum-silicon (Mo/Si) layer pairs. In another example, the RMLC 120 includes molybdenum-beryllium (Mo/Be) layer pairs. A thickness of each layer of each layer pair of the RMLC 120 is adjusted depending on a wavelength and an angle of incidence of light (such as extreme ultraviolet (EUV) radiation) incident on the mask 100, such that the mask 100 achieves maximum constructive interference of light reflected from different interfaces of the RMLC 120. In general, reflectivity of the RMLC increases as a number of layer pairs of the RMLC 120 increases. Accordingly, in principle, if the number of layer pairs is sufficiently large and extinction coefficients of the materials of the layers are close to zero, reflectivity of the RMLC 120 can approach 100% regardless of the difference of the refractive indices of the materials of the layers in the layer pairs. However, in the EUV wavelength range, the highest reflectivity that can be achieved is limited by the extinction coefficients of the materials employed for the layers of the RMLC 120. In the present example, the number of layer pairs of the RMLC 120 is from twenty to eighty. For example, in the depicted embodiment, to achieve more than 90% of the maximum achievable reflectivity (with the chosen materials) of the RMLC 120 and minimize mask blank manufacturing time and costs, the RMLC 120 includes about forty layer pairs, such as forty Mo/Si pairs (where N=80; layers 122$_1$, 122$_3$, ..., 122$_{79}$ include silicon and have a thickness of about 3 nm to 5 nm (for example, about 4 nm); and layers 122$_2$, 122$_4$, ..., 122$_{80}$ include molybdenum and have a thickness of about 2 nm to 4 nm (for example, about 3 nm). Alternatively, the RMLC 120 includes any other number of layer pairs, depending on reflectivity specifications for the mask 100. In other alternatives, the RMLC 120 may include layer groups, in other words, groups of three or more layers having different refractive indices and other characteristics to maximize reflectivity.

The RMLC 120 includes a phase-defect region that alters a phase of light reflected from the RMLC 120. In the depicted embodiment, a defect 130, such as a bump defect, is located on the surface 112 of the substrate 110. As illustrated in FIG. 1, the defect 130 causes a deformation in the layers of the RMLC 120 deposited on the surface 112 of the substrate 110. More specifically, a deformation occurs in each of the layers 122$_1$, 122$_2$, 122$_3$, 122$_4$, ..., 122$_N$ of the RMLC 120. The defect 130 thus propagates into each successively formed layer, such that the phase-defect region of the RMLC 120 extends from the bottommost layer (layer 122$_1$) to the topmost layer (layer 122$_N$). Alternatively, the phase-defect region extends through a limited number of the layers 122$_1$, 122$_2$, 122$_3$, 122$_4$, ..., 122$_N$ of the RMLC 120. In yet another alternative, where the phase-defect region extends through a limited number of the layers 122$_1$, 122$_2$, 122$_3$, 122$_4$, ..., 122$_N$, a defect in/on one of the layers causes deformations in the subsequently deposited layers, such that the deformations in the subsequently deposited layers are associated with the defect in/on the layer, instead of a defect on the surface of the substrate 110, such as the defect 130. The deformations of the RMLC 120 may have a different profile depending on the type of defects associated with the deformations and the processing conditions during the forming of the layers 122$_1$, 122$_2$, 122$_3$, 122$_4$, ..., 122$_N$ of the RMLC 120.

Light reflected from the RMLC 120 consists of all the light reflected from the various, different interfaces of the RMLC 120. In the present example, portions of the reflected light are phase shifted (in other words, have phase errors) because of the deformations of the layers 122$_1$, 122$_2$, 122$_3$, 122$_4$, ..., 122$_N$ in the RMLC 120 (here, resulting from the defect 130). The illustrated phase-defect region (the collection of deformations in the layers of the RMLC 120) thus largely impacts a phase of the light reflected from the RMLC 120, though it may minimally impact an amplitude of such reflected light. When small imaging wavelengths, such as EUV wavelengths, are used to illuminate the mask 100, the phase errors introduced in the reflected light by the phase-defect region of the RMLC 120 can be large, even if the deformations in the layers 122$_1$, 122$_2$, 122$_3$, 122$_4$, ..., 122$_N$ associated with the phase-defect region of the RMLC 120 may be small. For example, when the imaging wavelength is 13.5 nm, a defect having a height or depth of about 3.4 nm (about one fourth of the imaging wavelength) can introduce a phase error as much as 180°. Such phase shifts (errors) resulting from the phase-defect region of the RMLC 120 thus negatively impact the lithography processes using the mask 100. In fact, a phase error of only a small fraction of 180°, for example, as small as 30°, can negatively impact a lithography process window or patterning fidelity using the mask 100. Accordingly, it is desired that the substrate 110 (particularly the surface 112 of the substrate 110), as well as the RMLC 120, is free of defects, such as bump defects, pit defects, and other types of defects. However, achieving a defect-free substrate, as well as a defect-free RMLC, is difficult using conventional technology. The following discussion thus examines how to reduce the impact of such defects, particularly, the impact of phase-defect regions that result from such defects.

Figure 2:
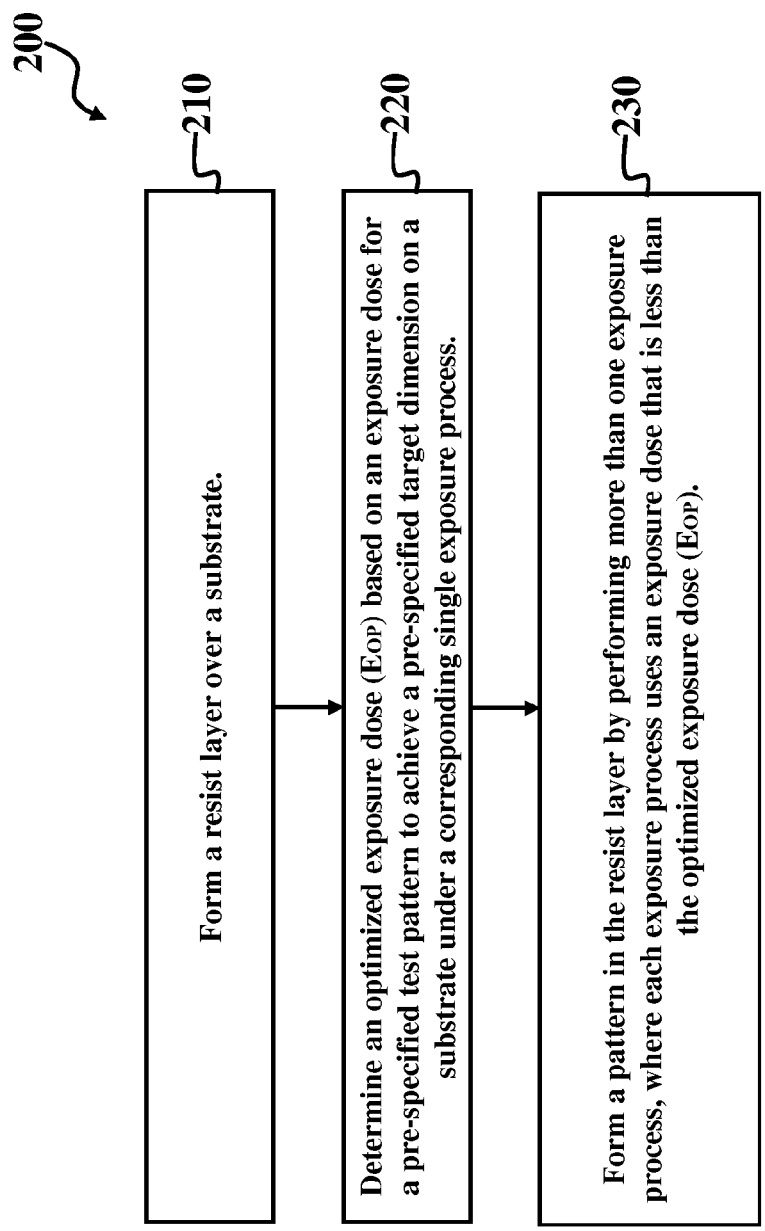
FIG. 2 is a flow chart of a method for forming a patterned resist layer according to various aspects of the present disclosure.

FIG. 2 is a flow chart of a method for forming a patterned resist layer according to various aspects of the present disclosure. The method 200 begins at block 210 where a resist layer is formed over a substrate. At block 220, an optimized exposure dose ($E_{OP}$) is determined. A given resist layer undergoing a given lithographic process has a definite threshold exposure dose ($E_{TH}$) that is the minimum exposure dose to reliably alter the behavior of an exposed portion of the resist layer compared to an unexposed portion (when patterns on the mask are large compared to the wavelength of the employed radiation source). For example, where the resist layer includes a positive-tone resist material, the exposed portions of the resist layer become soluble beyond the threshold exposure dose, such that the exposed portions of the resist layer are removed during a developing process and the developed resist layer includes the pattern. In another example, where the resist layer includes a negative-tone resist material, the exposed portions of the resist layer become insoluble beyond the threshold exposure dose, such that the unexposed portions of the resist layer are removed during a developing process and the developed resist layer includes the pattern. However, a variety of real-world effects may cause the threshold dose to be insufficient. For example, the effect of diffraction which reduces the contrast of the aerial image becomes prominent when the size of patterns on the mask is close to or smaller than the wavelength of the employed radiation source. In another example, a post-exposure baking process may exhibit effects such as acid diffusion in a chemically amplified resist, acid annihilation by a quencher, etc. To correct for these, in some embodiments, an optimized exposure dose may be determined based on an exposure dose for a pre-specified test pattern to achieve a pre-specified target dimension on a wafer under a corresponding single exposure process.

At block 230, a pattern is formed in the resist layer by performing a multiple exposure process. In some embodiments, the multiple exposure process is performed using extreme ultraviolet radiation (EUV), and the radiation for each exposure process may have approximately the same wavelength. In the multiple exposure process of block 230, each exposure process may utilize an exposure dose that is less than the optimized exposure dose and the total exposure dose ($E_T$) of the multiple exposure process approximately equals the optimized exposure dose (in other words, $E_1 < E_{OP}$, $E_2 < E_{OP}$, ..., $E_N < E_{OP}$ and $E_T = E_1 + E_2 + E_3 + ... + E_N \approx E_{OP}$, where N is a total number of exposure processes performed).

During each exposure process, the resist layer is exposed to a same pattern, such as a same integrated circuit pattern. In an example, each exposure process uses a different portion of a single mask to expose the resist layer, where each portion of the mask has the same pattern. In another example, each exposure process uses a different mask to expose the resist layer, where each mask has the same pattern. The single mask and the different masks can include defects (such as bump defects, pit defects, other types of defects, or combinations thereof) and phase-defect regions. Forming the pattern in the resist layer may further include a developing process, where a developing solution is applied to the exposed resist layer. The resist layer may also be exposed to a baking process before and/or after the resist layer is exposed. Additional steps can be provided before, during, and after the method 200, and some of the steps described can be replaced, eliminated, or moved around for additional embodiments of the method 200. The discussion that follows illustrates various embodiments of a resist layer that can be patterned according to the method 200 of FIG. 2.

Figure 3A:
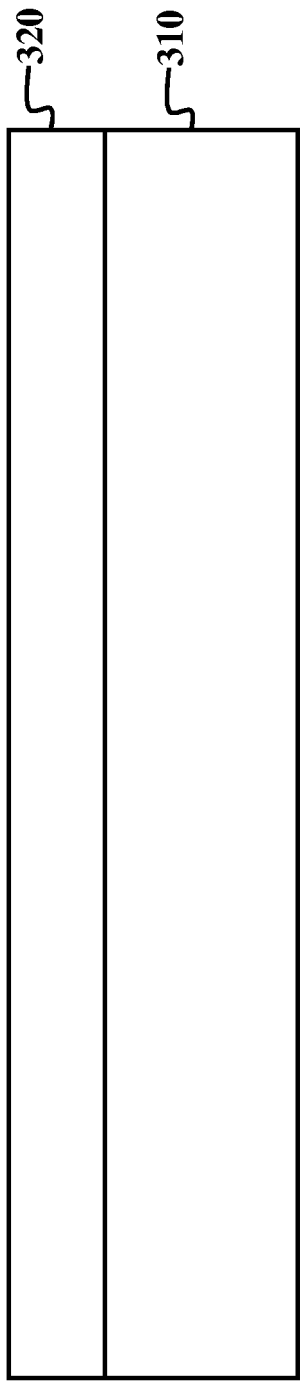
FIGS. 3A-3E are diagrammatic cross-sectional views of a resist layer during various stages of the method of FIG. 2 according to various aspects of the present disclosure.

FIGS. 3A-3E are various diagrammatic cross-sectional views of a resist layer during various stages of the method 200 of FIG. 2. FIGS. 3A-3E have been simplified for the sake of clarity to better understand the inventive concepts of the present disclosure. In FIG. 3A, a wafer 310 is provided. The wafer 310 is a substrate, a mask (also referred to as a photomask or reticle), or any base material on which processing is conducted to provide layers of material to form various features of an integrated circuit (IC) device. In the depicted embodiment, the wafer 310 is a semiconductor substrate including silicon (in other words, a silicon wafer). Alternatively or additionally, the wafer 310 includes another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the wafer 310 is a semiconductor on insulator (SOI) substrate. The wafer 310 may alternatively be referred to as a material layer, or the wafer 310 may include a material layer upon which a resist layer will be formed. In an example, the material layer is a metal layer, a semiconductor layer, or a dielectric layer. In another example, the material layer is a hard mask layer, such as a silicon oxide layer or a silicon nitride layer.

A resist layer 320 is deposited over the wafer 310, for example, by a spin-on coating technique. The resist layer 320 is also referred to as a photoresist layer, photosensitive layer, imaging layer, patterning layer, or radiation sensitive layer. A rinsing process, such as a de-ionized (DI) water rinse, may be performed on the wafer 310 before depositing the resist layer 320. The resist layer 320 may be subjected to a baking process, such as a soft baking process (also referred to as a post-applied baking process). In the depicted embodiment, the resist layer 320 includes positive-tone resist material. Alternatively, the resist layer 320 includes negative-tone resist material. The resist layer 320 has any suitable thickness, such as a thickness of about 10 nanometers (nm) to about 1,000 nm.

Figure 3B:
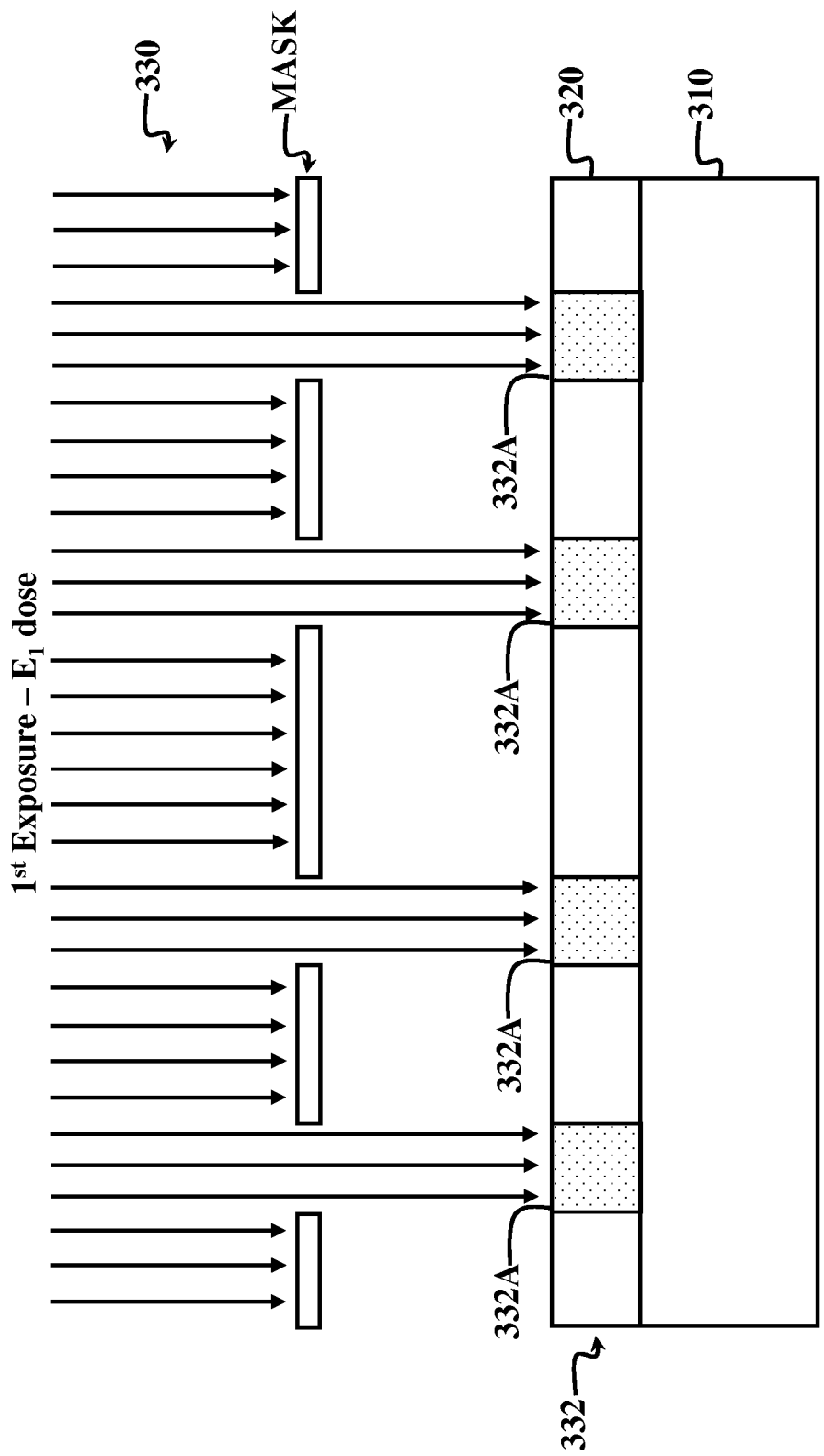
Figure 3C:
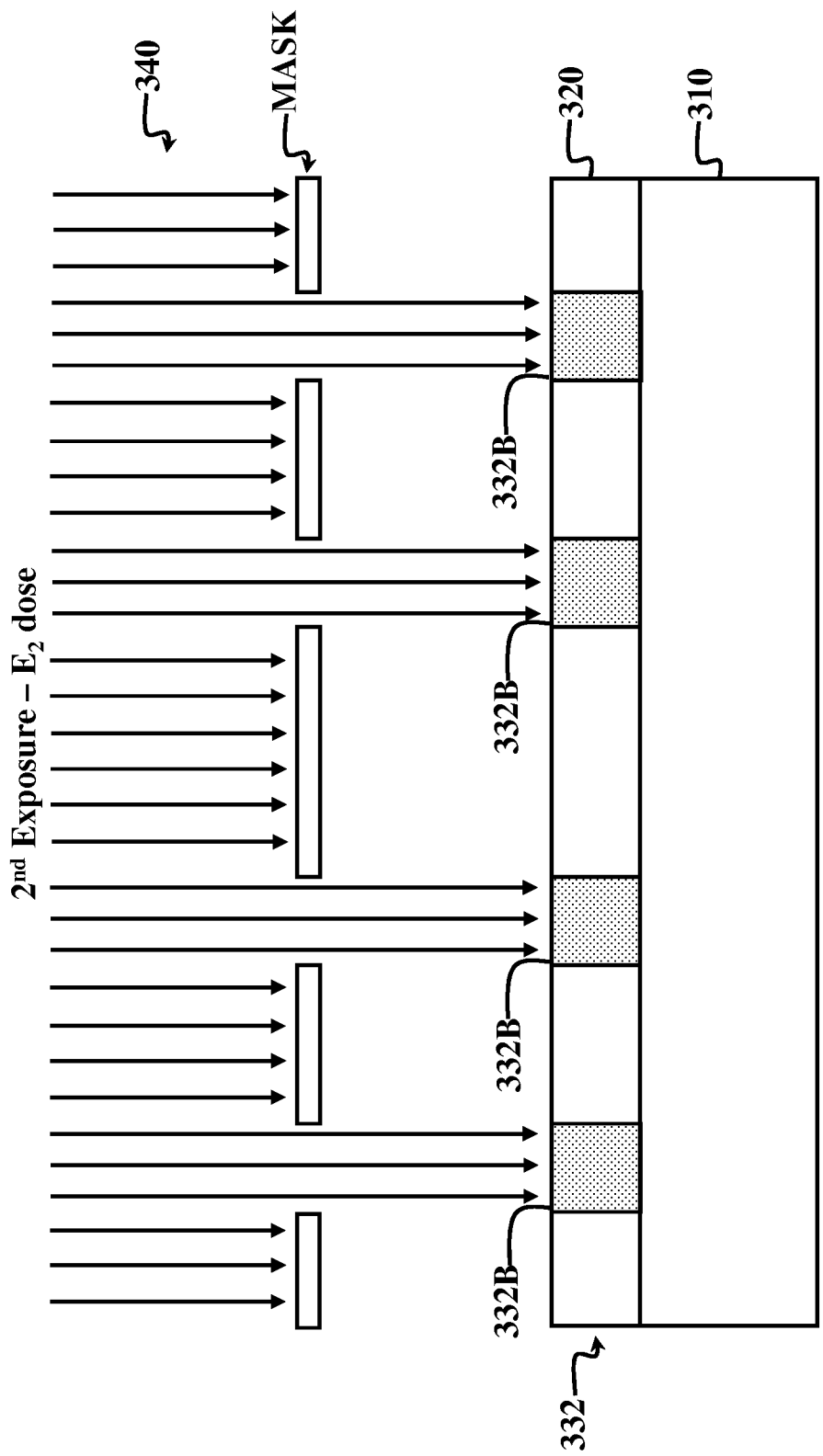
Figure 3D:
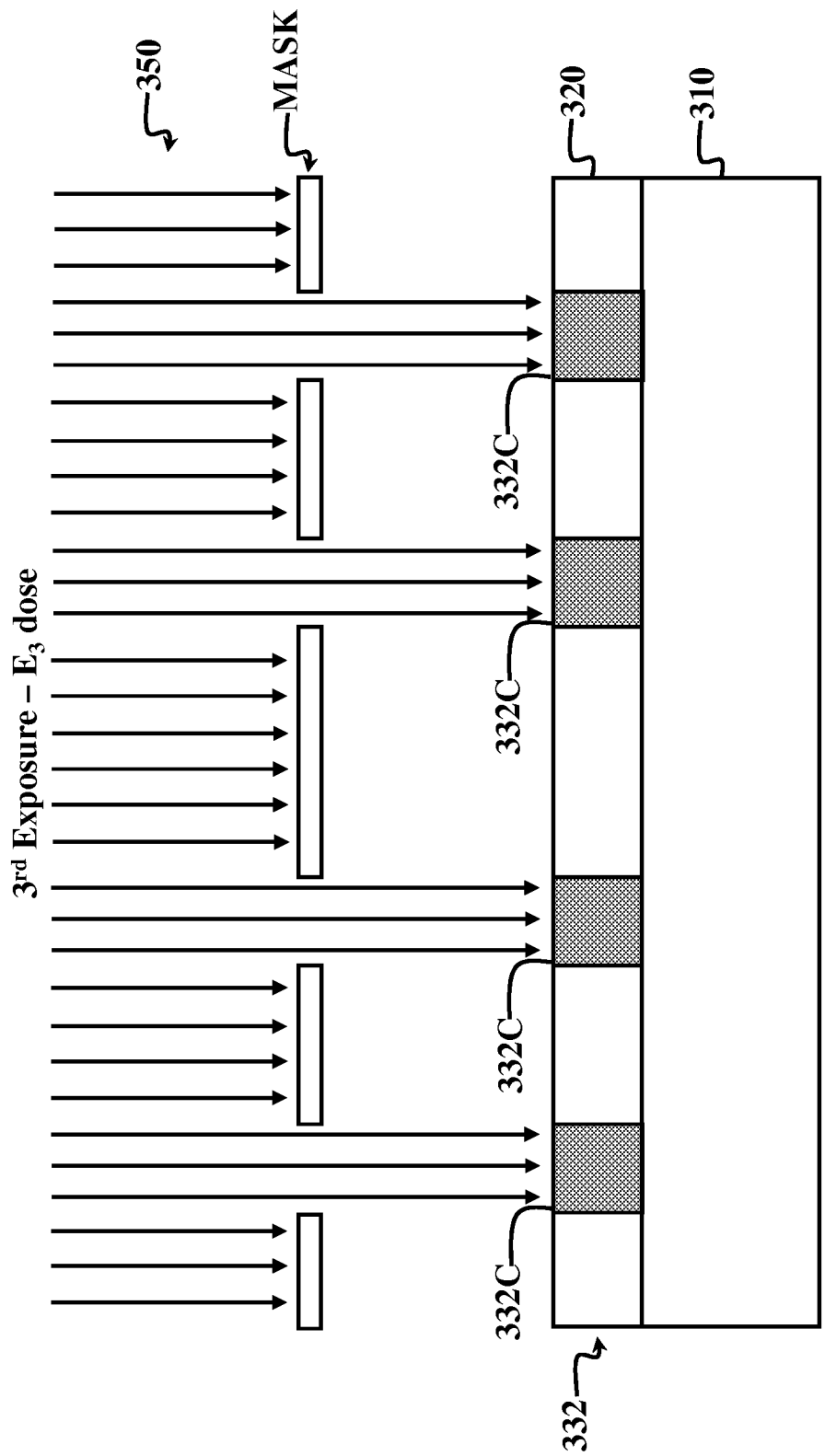

In FIGS. 3B-3E, the resist layer 320 is patterned to form a patterned resist layer 320A. Patterning the resist layer 320 includes performing more than one exposure process as depicted in FIGS. 3B-3D, where each exposure process uses an exposure dose less than the optimized exposure dose $E_{OP}$ for a corresponding single exposure process. In the depicted embodiment, a first exposure process 330 (FIG. 3B), a second exposure process 340 (FIG. 3C), and a third exposure process 350 (FIG. 3D) each use a different mask to selectively illuminate the resist layer 320 respectively with a first exposure dose ($E_1$), a second exposure dose ($E_2$), and a third exposure dose ($E_3$) of radiation, thereby forming a latent image pattern 332 in the resist layer 320. The first exposure dose ($E_1$), the second exposure dose ($E_2$), and the third exposure dose ($E_3$) are each less than the optimized exposure dose ($E_{OP}$). Further, in the present example, a total exposure dose ($E_T$) of the first exposure dose ($E_1$), second exposure dose ($E_2$), and third exposure dose ($E_3$) is approximately equal to the optimized exposure dose ($E_{OP}$) (in other words, $E_T = E_1 + E_2 + E_3 \geq E_{OP}$), so that the latent image pattern 332 is developable after the third exposure process 350. In the depicted embodiment, the first exposure process 330, the second exposure process 340, and the third exposure process 350 illuminate the resist layer 320 with radiation having a wavelength less than about 100 nm, such as radiation in an extreme ultraviolet (EUV) range, x-ray range, deep ultraviolet range, vacuum ultraviolet range, or combinations thereof. In an example, the radiation is EUV radiation having a wavelength equal to about 13.5 nm. Alternatively, the radiation has a wavelength range greater than about 100 nm. For example, a radiation source may be a light source, such as a krypton fluoride (KrF) excimer laser with a wavelength of 248 nm, an argon fluoride (ArF) excimer laser with a wavelength of 193 nm, a fluorine dimer ($F_2$) excimer laser with a wavelength of 157 nm, or other light sources. It is noted that, in alternate embodiments, only two exposure processes or more than three exposure processes may form a developable latent image pattern in the resist layer 320.

Figure 4A:
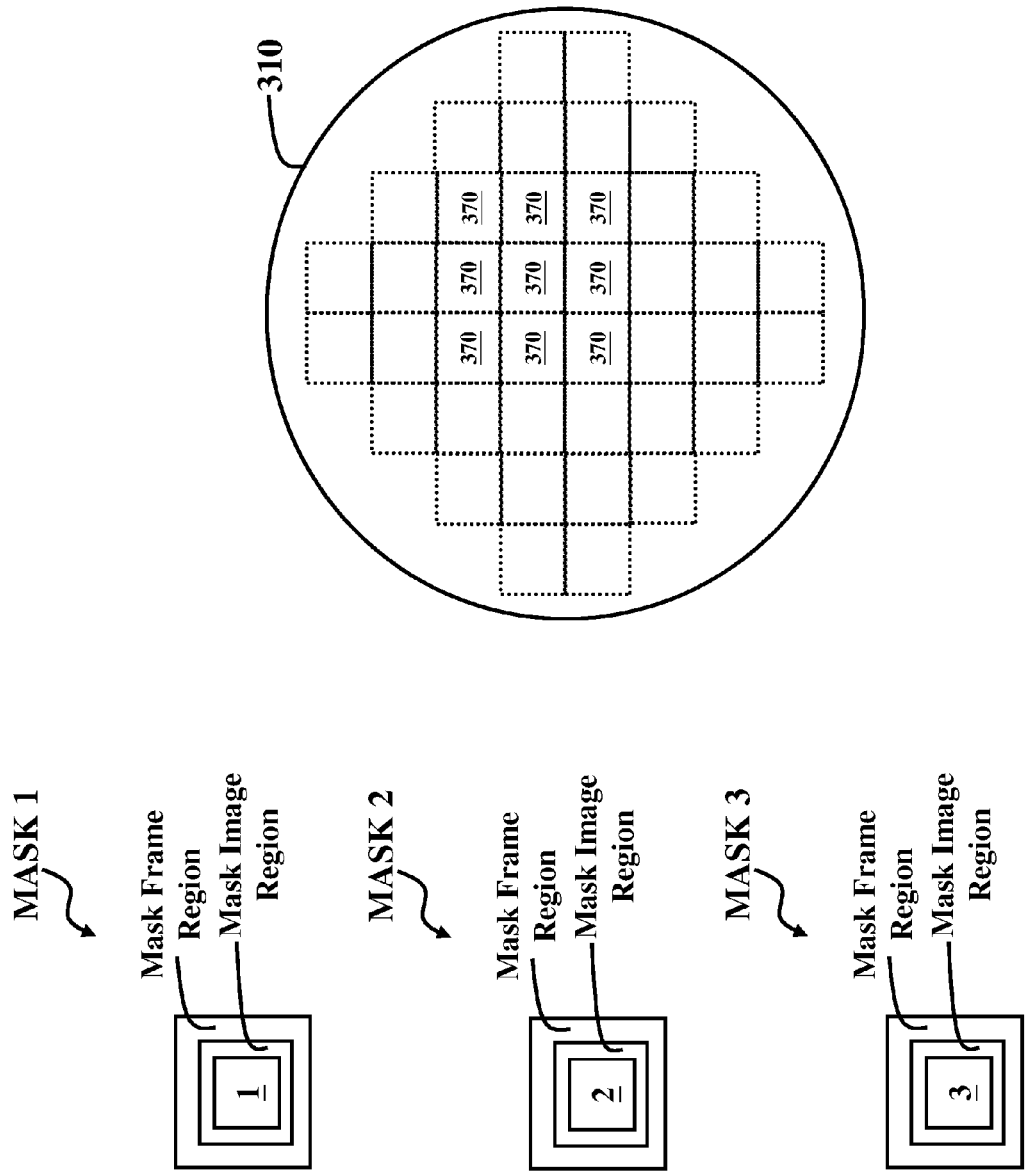
FIGS. 4A-4E are top schematic views of patterning a resist layer (such as the resist layer in FIGS. 3A-3E) using different masks in the method of FIG. 2 according to various aspects of the present disclosure.
Figure 4C:
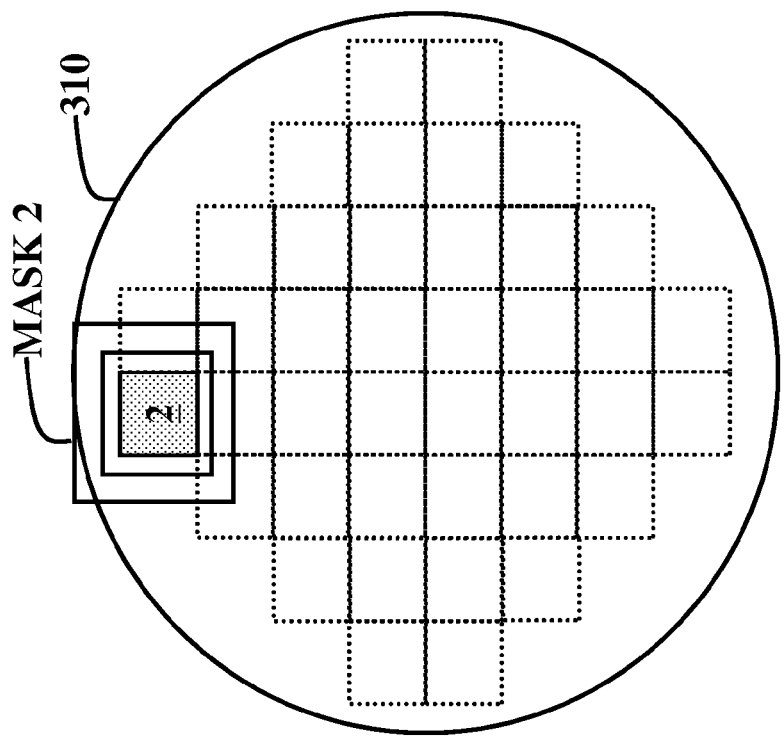

The masks used in the first exposure process 330, the second exposure process 340, and the third exposure process 350 include a pattern, such as an integrated circuit pattern according to a design layout, that is transferred to the resist layer 320 during each of the exposure processes 330, 340, and 350. In an example, different masks having the same integrated circuit pattern are used in the first exposure process 330, the second exposure process 340, and the third exposure process 350. For example, referring to FIGS. 4A-4E, a first mask having the integrated circuit pattern is used in the first exposure process 330, a second mask (that is different than the first mask) having the same integrated circuit pattern is used in the second exposure process 340, and a third mask (that is different than the first mask and the second mask) having the same integrated circuit pattern is used in the third exposure process 350. In FIG. 4A, MASK 1, MASK 2, and MASK 3 each include a mask imaging region and a mask frame region. The mask imaging region is an area of each mask that includes a pattern (or design) of a layer of an integrated circuit device, and the mask frame region is an area of each mask that does not include the pattern of the layer of the integrated circuit device. The mask frame region may include alignment marks (also referred to as fiducial marks). The mask imaging region of MASK 1 includes an integrated circuit pattern 1, the mask imaging region of MASK 2 includes an integrated circuit pattern 2, and the mask imaging region of MASK 3 includes an integrated circuit pattern 3. In the depicted embodiment, the integrated circuit patterns 1, 2, and 3 are the same integrated circuit patterns. MASK 1, MASK 2, and MASK 3 are used to respectively transfer the integrated circuit patterns 1, 2, and 3 (which are the same) to the wafer 310, particularly to the resist layer 320 (not shown in FIGS. 4A-4E) deposited on the wafer 310, multiple times. For example, MASK 1, MASK 2, and MASK 3 are used in a multiple exposure process to transfer the integrated circuit pattern to various fields of the wafer 310. Each field represents an area of the wafer 310 that will be processed at a given time, and in the depicted embodiment, each field corresponds to at least one integrated circuit device area 370, such as an integrated circuit die. For example, an exposure tool (such as a stepper or a scanner) processes one field (such as exposing a field of the wafer 310 (here, corresponding with a single integrated circuit device area 370) to the MASK 1), then processes the next field (such as exposing another field corresponding with another single integrated circuit device area 370 of the wafer 310 to the MASK 1), and so on, and then repeats with MASK 2 and MASK 3, such that each integrated circuit device area 370 is exposed to the integrated circuit patterns 1, 2, and 3 respectively of MASK 1, MASK 2, and MASK 3.

Figure 4B:
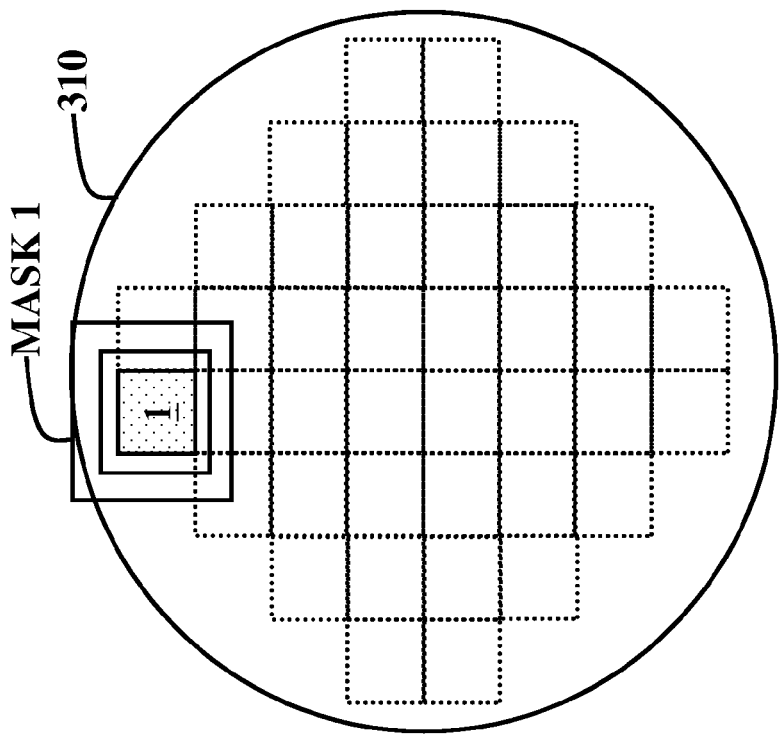
Figure 4E:
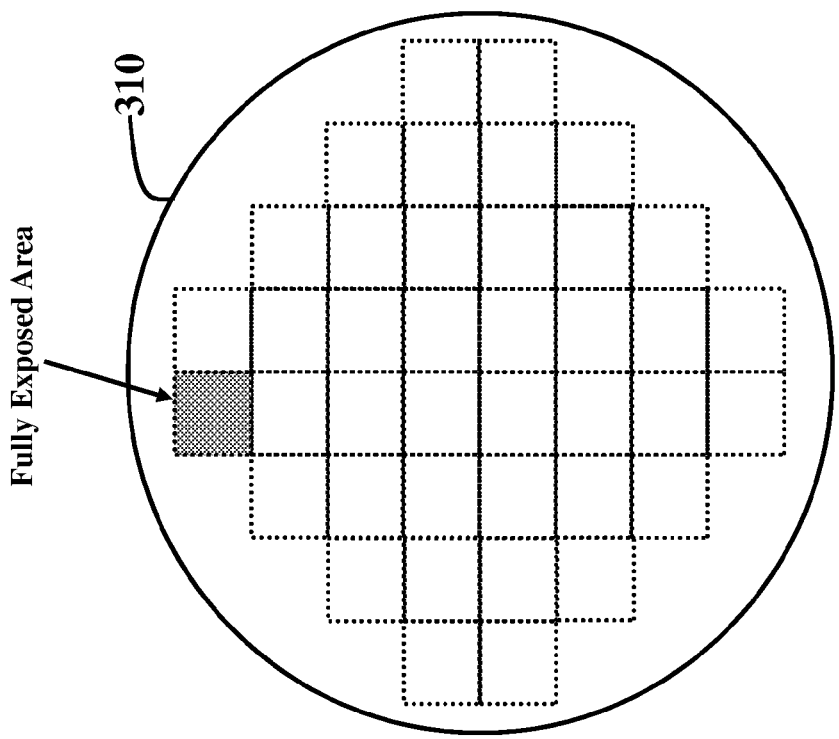
Figure 4D:
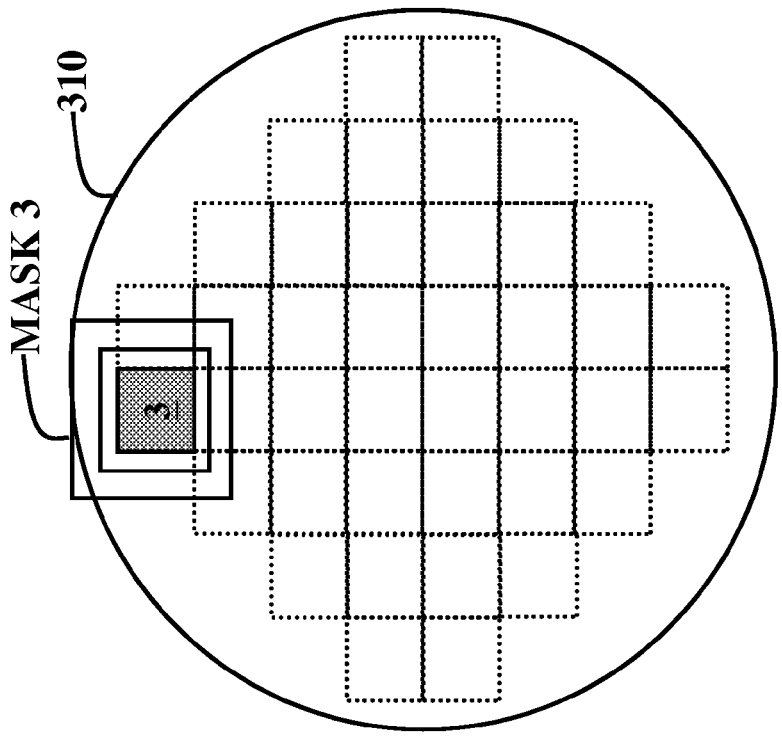

For ease of discussion, the present example illustrates full exposure of a single integrated circuit device area 370 (top, left integrated circuit device area 370 of the wafer 310), however, it is understood that multiple integrated circuit device areas 370 are processed and fully exposed during wafer fabrication. Referring to FIG. 3B and FIG. 4B, the first exposure process 330 projects radiation of the first exposure dose ($E_1$) onto the MASK 1, and a portion of the radiation is transmitted to the resist layer 320, thereby transferring the pattern of MASK 1 to the resist layer 320 to form the latent image pattern 332 that includes latent image portions 332A. In the depicted embodiment, where the resist layer 320 includes a positive-tone resist material, the latent image portions 332A become partially soluble. Then, referring to FIG. 3C and FIG. 4C, the second exposure process 340 projects radiation of the second exposure dose ($E_2$) onto the MASK 2, and a portion of the radiation is transmitted to the resist layer 320, thereby transferring the pattern of MASK 2 to the resist layer 320 to increase solubility of the latent image pattern 332, particularly latent image portions 332A. The latent image pattern 332 thus includes latent image portions 332B, which are more soluble than the latent image portions 332A. The solubility of the latent image portions is increased because of the additional exposure dose provided in the second exposure process 340. Referring to FIG. 3D and FIG. 4D, the third exposure process 330 projects radiation of the third exposure dose ($E_3$) onto the MASK 3, and a portion of the radiation is transmitted to the resist layer 320, thereby transferring the pattern of MASK 3 to the resist layer 320 to further increase the solubility of the latent image pattern 332, particularly latent image portions 332B. The latent image pattern 332 thus includes latent image portions 332C, which are more soluble than the latent image portions 332B. Because the total exposure dose of the first exposure dose ($E_1$), second exposure dose ($E_2$), and third exposure dose ($E_3$) are approximately equal to the optimized exposure dose ($E_{OP}$), the latent image portions 332C are soluble so that latent image pattern 332 is developable. In FIG. 4E, the masks have been removed to illustrate that the exposed region of the wafer 310 (here, the top, left integrated circuit device area 370 of the wafer 310) has received the optimized exposure dose.

Figure 5A:
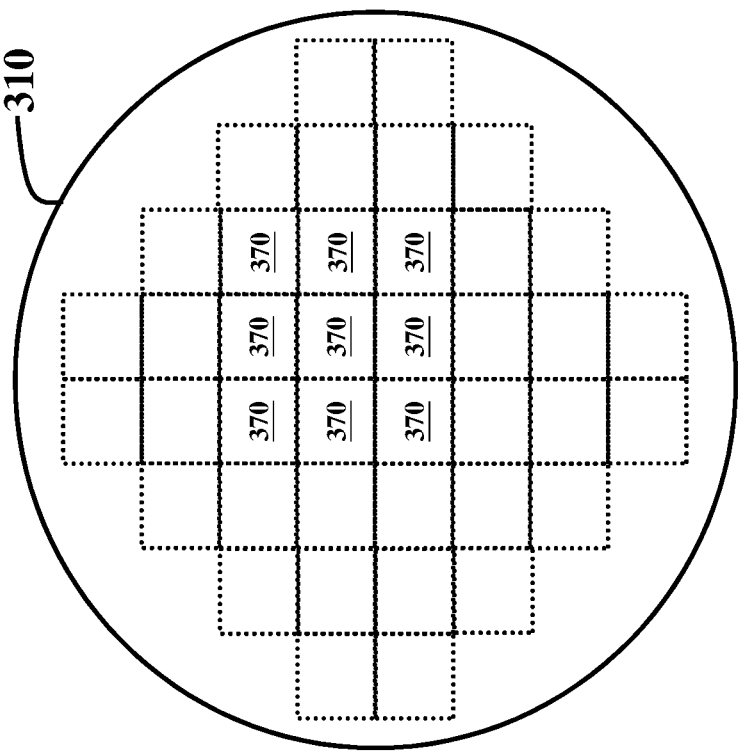
FIGS. 5A-5E are top schematic views of patterning a resist layer (such as the resist layer in FIGS. 3A-3E) using different portions of a mask in the method of FIG. 3 according to various aspects of the present disclosure.
Figure 5A:
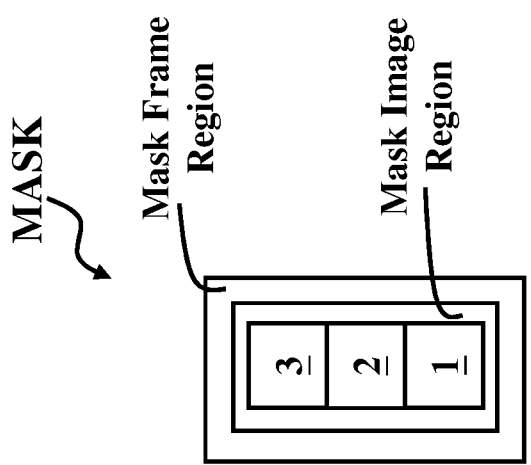
Figure 5C:
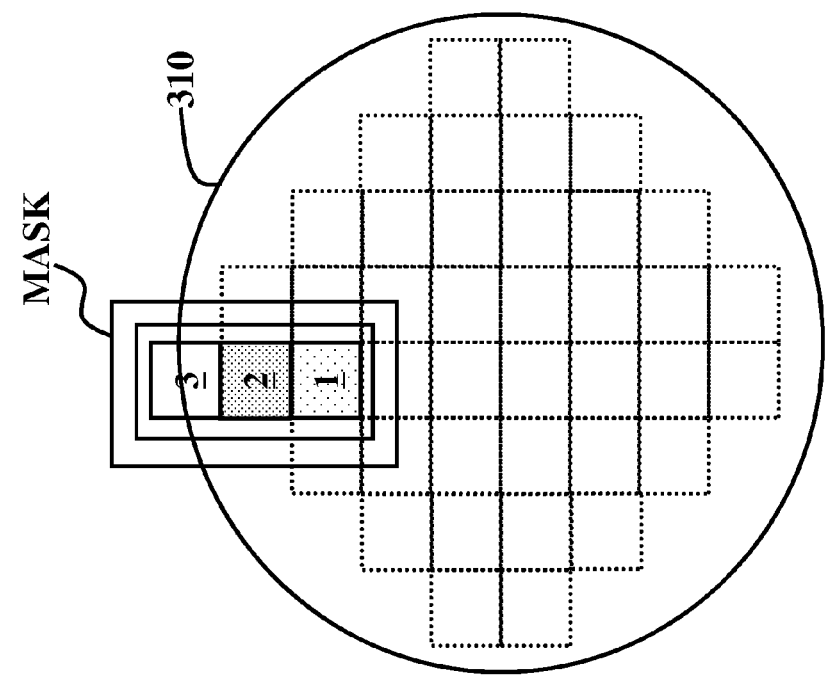

In another example, different portions of a same mask having the same integrated circuit pattern are used in the first exposure process 330, the second exposure process 340, and the third exposure process 350. For example, referring to FIGS. 5A-5E, a first portion of a mask having the integrated circuit pattern is used in the first exposure process 330, a second portion of the mask (that is different than the first portion) having the same integrated circuit pattern is used in the second exposure process 340, and a third portion of the mask (that is different than the first portion and the second portion) having the same integrated circuit pattern is used in the third exposure process 350. In FIG. 5A, a MASK includes a mask imaging region and a mask frame region, where the mask imaging region includes a first portion that includes an integrated circuit pattern 1, a second portion that includes an integrated circuit pattern 2, and a third portion that includes an integrated circuit pattern 3. In the depicted embodiment, the integrated circuit patterns 1, 2, and 3 are the same integrated circuit patterns. The MASK is used to transfer the integrated circuit patterns 1, 2, and 3 (which are the same) to a wafer 310, particularly to the resist layer 320 (not shown in FIGS. 5A-5E) deposited on the wafer 310, multiple times. For example, the MASK is used in a multiple exposure process to transfer the integrated circuit pattern to various fields of the wafer 310. As noted above, each field represents an area of the wafer 310 that will be processed at a given time, and in the depicted embodiment, each field corresponds to at least one integrated circuit device area 370, such as an integrated circuit die. For example, an exposure tool (such as a stepper or a scanner) processes one field (such as exposing a field of the wafer 310 to the MASK (here, corresponding with a set of three integrated circuit device areas 370)), then processes the next field, and so on, such that each integrated circuit device area 370 is exposed to the integrated circuit patterns 1, 2, and 3 respectively of the first, second, and third portions of the MASK.

Figure 5B:
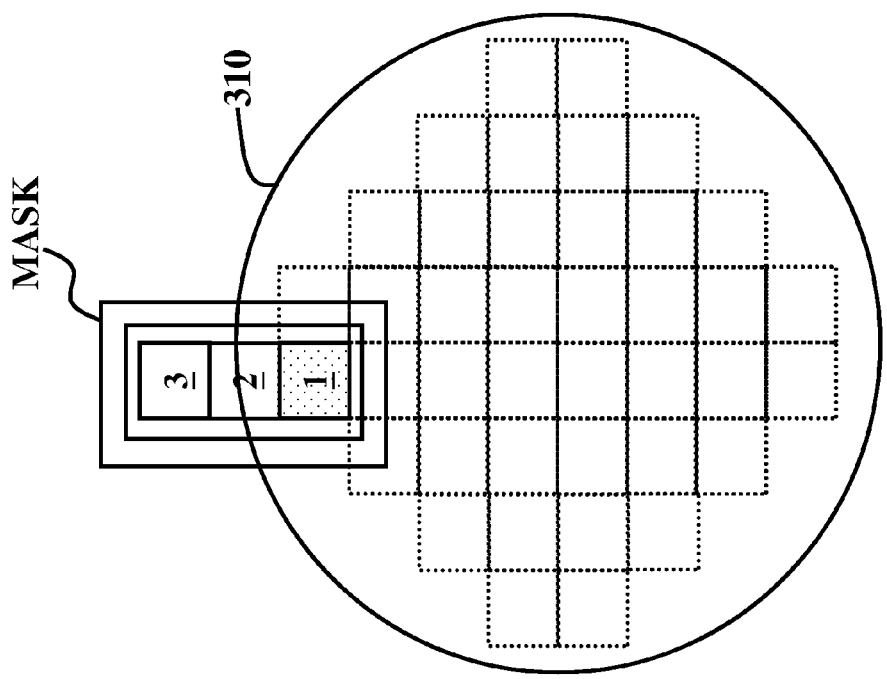
Figure 5E:
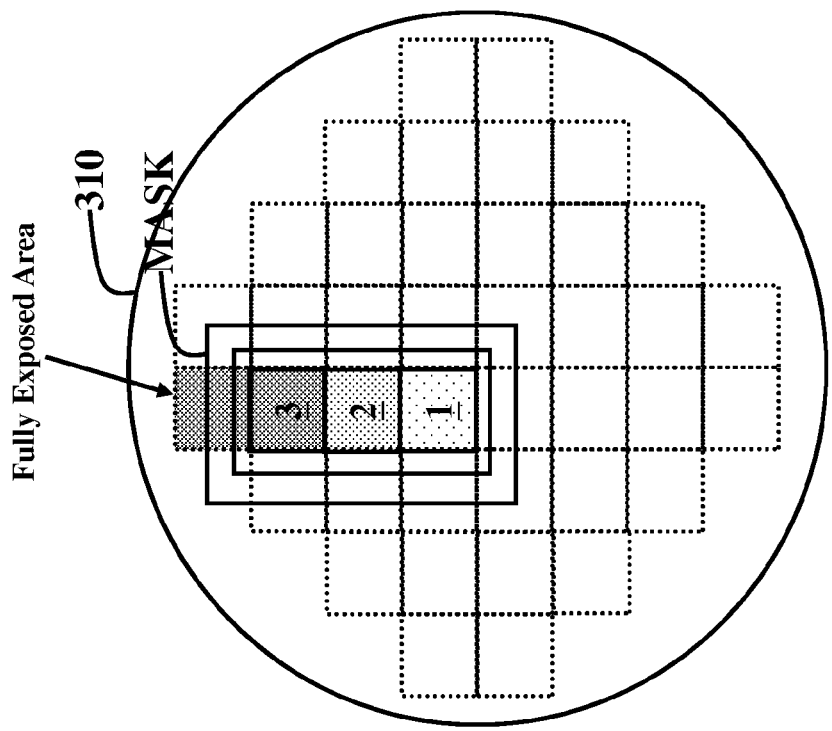
Figure 5D:
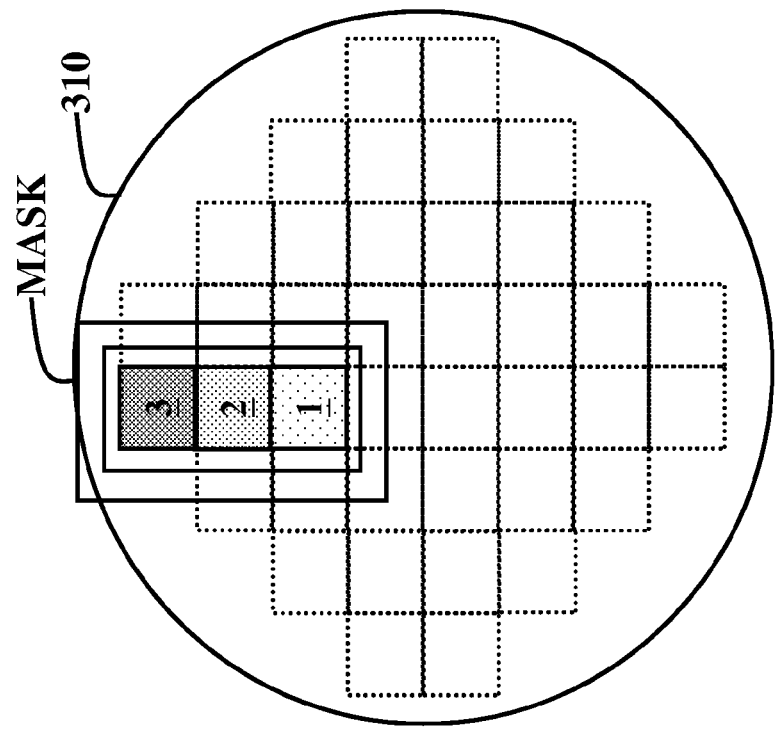

For ease of discussion, the present example illustrates full exposure of a single integrated circuit device area 370 (top, left integrated circuit device area 370 of the wafer 310). However, it is understood that multiple integrated circuit device areas 370 are processed and fully exposed during wafer fabrication. Referring to FIG. 3B and FIG. 5B, the first exposure process 330 aligns the first portion of the MASK having the integrated circuit pattern 1 with one of the integrated circuit device areas 370 (here, the top, left integrated circuit device area 370) and projects radiation of the first exposure dose ($E_1$) onto the MASK. A portion of the radiation is transmitted to the resist layer 320, thereby transferring the integrated circuit pattern 1 of the first portion of the MASK to the resist layer 320 to form the latent image pattern 332 that includes latent image portions 332A. In the depicted embodiment, where the resist layer 320 includes a positive-tone resist material, the latent image portions 332A become partially soluble. Then, referring to FIG. 3C and FIG. 5C, the second exposure process 340 aligns the second portion of the MASK having the integrated circuit pattern 2 with the same integrated circuit device area 370 (here, the top, left integrated circuit device area 370) and projects radiation of the second exposure dose ($E_2$) onto the MASK. The first portion of the MASK also aligns with another integrated circuit device area 370 of the wafer 310 during the second exposure process 340. A portion of the radiation is transmitted to the resist layer 320, thereby transferring the integrated circuit patterns 1 and 2 respectively of the first and second portions of the MASK to the resist layer 320. In the present example, solubility of the latent image pattern 332, particularly the latent image portions 332A, is increased in the top, left integrated circuit device area 370. The latent image pattern 332 thus includes latent image portions 332B, which are more soluble than the latent image portions 332A. The solubility of the latent image portions is increased because of the additional exposure dose provided in the second exposure process 340. In furtherance of the present example, the other integrated circuit device area 370 exposed to the first portion of the MASK includes the latent image portions 332A since it has been subjected to only the second exposure process 340. Referring to FIG. 3D and FIG. 5D, the third exposure process 330 aligns the third portion of the MASK having the integrated circuit pattern 3 with the same integrated circuit device area 370 (here, the top, left integrated circuit device area 370) and projects radiation of the third exposure dose ($E_3$) onto the MASK. A portion of the radiation is transmitted to the resist layer 320, thereby transferring the integrated circuit patterns 1, 2, and 3, respectively of the first, second, and third portions of the MASK to the resist layer 320. In the present example, solubility of the latent image pattern 332, particularly the latent image portions 332B, is increased in the top, left integrated circuit device area 370. The latent image pattern 332 thus includes latent image portions 332C, which are more soluble than the latent image portions 332B. Because the total exposure dose of the first exposure dose ($E_1$), the second exposure dose ($E_2$), and the third exposure dose ($E_3$) are approximately equal to the optimized exposure dose ($E_{OP}$), the latent image portions 332C are soluble so that latent image pattern 332 is developable in the top, left integrated circuit device area 370. In furtherance of the present example, the other integrated circuit device area 370 exposed to the second portion of the MASK includes the latent image portions 332B since it has been subjected to the second exposure process 340 and the third exposure process 350, and another integrated circuit device area 370 exposed to the first portion of the MASK includes the latent portions 332A since it has been subjected to only the third exposure process 350. In FIG. 5E, as a subsequent exposure process is performed, the top left integrated circuit device are 370 has been fully exposed since it has received the optimized exposure dose. The aforementioned multiple exposure process is fully compatible with the actions taken by a scanner when exposing the whole wafer by stepping and scanning. The wafer stage of the scanner only needs to move by a fraction of the field size in the scanning direction during stepping in the scanning direction and move by the full field size in the scanning direction during scanning. The impact to wafer throughput resulting from the multiple exposure process can thus be minimized. Besides reducing the impact of randomly distributed mask defects, the method is also effective in reducing the impacts of other random errors, such as line edge roughness and registration errors of mask patterns.

Using a multiple exposure process to form the latent image pattern 332 in the resist layer 320, where each exposure process exposes the resist layer 320 to a same pattern using an exposure dose that is less than the optimized exposure dose, reduces impact of defects or defect regions of the masks used during the multiple exposure process. For example, in the depicted embodiment, the masks used during the first exposure process 330, the second exposure process 340, and the third exposure process 350 have defects or defect regions, such as those described with reference to the mask 100 illustrated in FIG. 1. In the example where different masks are used, MASK 1, MASK 2, and/or MASK 3 include a phase-defect region. Or, in the example where different portions of the MASK are used, one or more of the different portions include a phase-defect region. Because the exposure dose projected onto the MASK 1, the MASK 2, and the MASK 3 or the different portions of the MASK is less than the optimized exposure dose, the impact of such phase-defect regions in the MASK 1, the MASK 2, and the MASK 3 or the different portions of the MASK is greatly reduced. Since such defects or defect regions are randomly located on the various masks or various portions of the mask, no defect or defect region will receive a full exposure dose. More specifically, an aerial image intensity impacted by each individual defect or defect region is reduced, thereby reducing printability of such defect or defect region. Different embodiments may have different advantages, and no particular advantage is required of any embodiment. In an example, the exposure dose for each exposure process approximately equals the optimized exposure dose ($E_{OP}$) divided by N, where N is a total number of exposure processes. Accordingly, in the present example, the first exposure dose ($E_1$), the second exposure dose ($E_2$), and the third exposure dose ($E_3$) are equal to one third of the optimized exposure dose ($E_{OP}$). Alternatively, the first exposure dose ($E_1$), the second exposure dose ($E_2$), and the third exposure dose ($E_3$) are approximately equal to varying fractions of the optimized exposure dose ($E_{OP}$). The exposure dose of each of the plurality of EUV exposure processes can be adjusted according to defect printability. For example, if a defect on a mask or a mask region is more printable, the exposure dose for the mask or the mask region is then reduced.

Figure 3E:
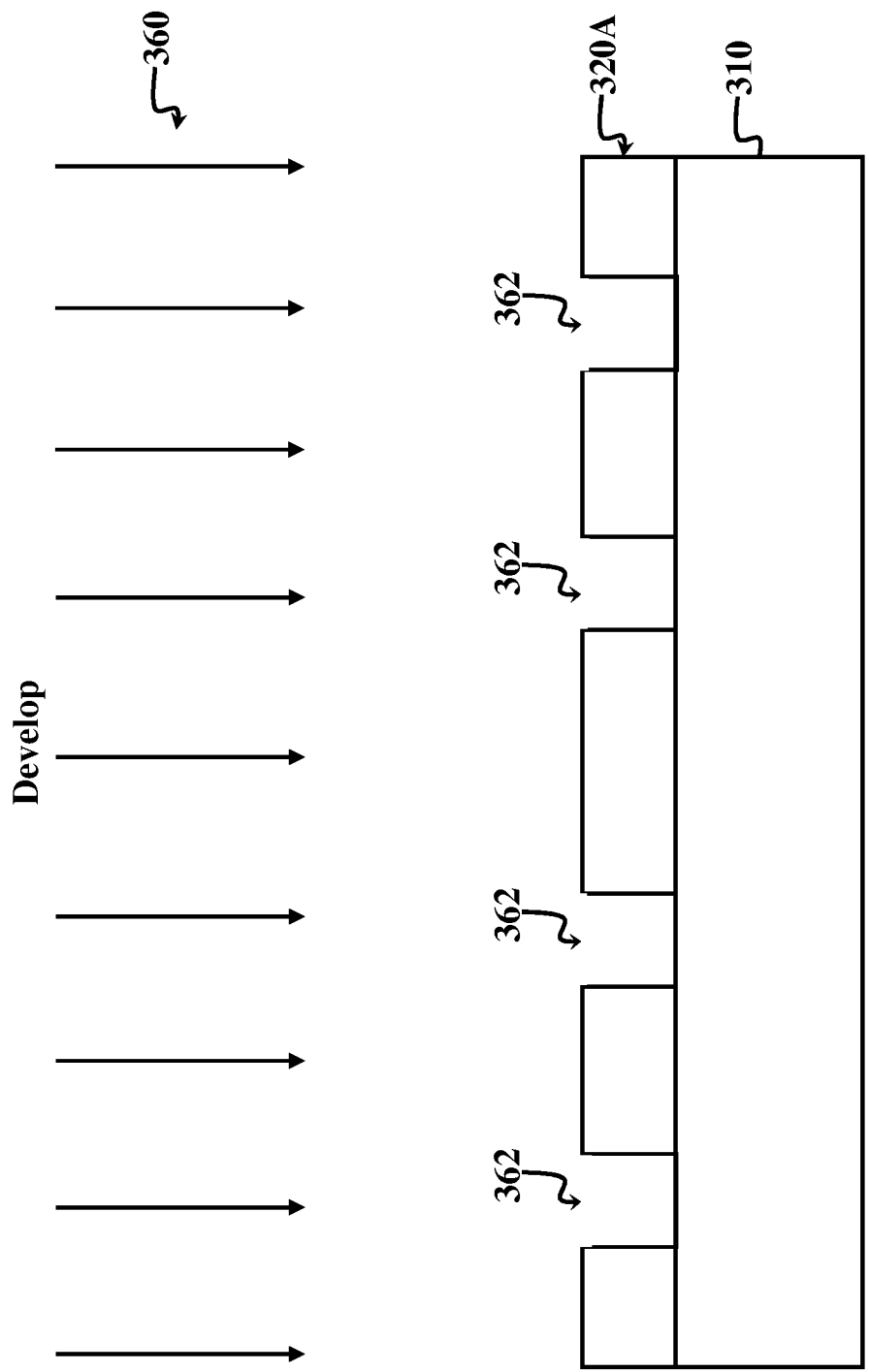

Subsequently, the resist layer 320 may be subjected to a post-exposure bake (PEB) process. Referring to FIG. 3E, a developing process 360 is performed on the resist layer 320, thereby providing the patterned resist layer 320A. During the developing process 360, a developing solution is applied to the resist layer 320. In an example, the developing solution is a basic solution, such as tetramethylammonium hydroxide (TMAH). Any concentration level of TMAH developer solution is utilized depending on characteristics of the resist layer 320, such as approximately 2.38% TMAH developer solution. The developing solution removes exposed or unexposed portions of the resist layer 320 depending on the resist material. For example, in the present example, the resist layer 320 includes positive-tone resist material, so the developing process 360 removes (dissolves) the exposed portions of the resist layer 320 (the latent image pattern 322), leaving the unexposed portions of the resist layer 320 over the wafer 310. Alternatively, where the resist layer 320 includes negative-tone resist material, the developing process 360 removes (dissolves) the unexposed portions of the resist layer 320, leaving the exposed portions of the resist layer 620 over the wafer 610. A rinsing process, such as a de-ionized (DI) water rinse. The rinsing process may remove residue particles. The patterned resist layer 320A includes openings 362 that expose portions of the underlying wafer 310. Subsequent processing may include removing portions of the exposed wafer 310. Alternatively, metal deposition, ion implantation, or other processes can be carried out over/on the wafer 310. The patterned resist layer 320A may then be removed (or stripped) by any suitable process. For example, the patterned resist layer 320A may be removed with a fluid (or stripping solution). In some instances, where the exposed portions of the wafer 310 are subjected to an ion bombardment or plasma treatment process, the fluid strips the ion bombarded, patterned resist layer 320A and/or the plasma treated, patterned resist layer 320A. After the patterned resist layer 320A is removed, subsequent processing may continue to complete fabrication of an integrated circuit device. For example, additional patterning processes, etching processes, deposition processes, and other processes may be performed to form additional features of the integrated circuit device.

The present disclosure provides an extreme ultraviolet lithography (EUVL) method which has many different embodiments. The EUVL method comprises providing at least two mask areas having a same pattern, forming a resist layer over a substrate, determining an optimized exposure dose based on an exposure dose for a pre-specified pattern on one of the at least two mask areas to achieve a pre-specified target dimension under a corresponding single exposure process, and performing a multiple exposure process for exposing a same area of the resist layer to the same pattern. The multiple exposure process comprises a plurality of exposure processes, wherein each of the plurality of exposure processes uses an exposure dose that is less than the optimized exposure dose and a sum of the exposure dose of each of the plurality of exposure processes is approximately equal to the optimized exposure dose. In one example, the exposing a same area of the resist layer to the same pattern includes using at least two image areas of a mask to expose the resist layer, wherein each of the at least two image areas includes the same pattern. In another example, the exposing a same area of the resist layer to the same pattern includes using at least two masks to expose the resist layer, wherein each of the at least two masks includes the same pattern. The mask areas used during the multiple exposure process may include a defect. The method may further include baking and developing the resist layer after performing the multiple exposure process. The method may further include transferring a pattern of the exposed, baked, and developed resist layer to the substrate.

An exemplary extreme ultraviolet lithography (EUVL) method comprises providing at least two mask areas having a same pattern, forming a resist layer over a substrate, determining an optimized exposure dose based on an exposure dose for a pre-specified pattern on one of the at least two mask areas to achieve a pre-specified target dimension under a corresponding single exposure process, and forming a latent image in the resist layer using the at least two mask areas. At least one of the at least two mask areas includes a defect. The forming a latent image in the resist layer includes performing at least two exposure processes on a same area of the resist layer, wherein each of the at least two exposure processes uses an exposure dose that is less than the optimized exposure dose and wherein a sum of the exposure dose of each of the at least two exposure processes is approximately equal to the optimized exposure dose. In one example, the performing at least two exposure processes includes each of the at least two exposure processes projecting the same pattern of the at least two mask areas from a mask on the same area of the resist layer. In another example, the performing at least two exposure processes includes each of the at least two exposure processes projecting the same pattern of the at least two mask areas from at least two masks on the same area of the resist layer. The EUVL method may further include baking and developing the resist layer after forming the latent image pattern in the resist layer, thereby forming a patterned resist layer.

An exemplary method comprises providing a first mask area, providing a second mask area having a same pattern as the first mask area, forming a resist layer over a substrate, determining an optimized exposure dose for the resist layer, and exposing a same area of the resist layer to the first mask area with a first exposure dose and to the second mask area with a second exposure dose, wherein the first exposure dose and the second exposure dose are each less than the optimized exposure dose. In one example, the exposing a same area of the resist layer to the first mask area with a first exposure dose includes using a first mask, and the exposing the same area of the resist layer to the second mask area with a second exposure dose includes using a second mask, wherein the first mask and the second mask have a same pattern. The first mask, the second mask, or both the first mask and the second mask may include a defect. In another example, the exposing a same area of the resist layer to the first mask area with a first exposure dose includes using a first portion of a mask, and the exposing the same area of the resist layer to the second mask area with a second exposure dose includes using a second portion of the mask, wherein the first portion and the second portion of the mask have a same pattern. One of the first portion, the second portion, and both the first portion and the second portion may include a defect.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet lithography (EUVL) method, the EUVL method comprising:
   providing at least two mask areas having a same pattern;
   forming a resist layer over a substrate;
   determining an optimized exposure dose; and
   performing a multiple exposure process to expose a same area of the resist layer to the same pattern, the multiple exposure process comprising a plurality of exposure processes;
   wherein each of the plurality of exposure processes uses an exposure dose that is less than the optimized exposure dose.

2. The method of claim 1 wherein the performing a multiple exposure process includes using at least two mask areas of a mask to expose the resist layer.

3. The method of claim 2 wherein at least one of the at least two mask areas of a mask includes a defect.

4. The method of claim 1 wherein the performing a multiple exposure process includes using at least two mask areas of at least two masks to expose the resist layer.

5. The method of claim 4 wherein at least one of the at least two mask areas of at least two masks includes a defect.

6. The method of claim 1 wherein the optimized exposure dose is based on an exposure dose for a pre-specified pattern on one of the at least two mask areas to achieve a pre-specified target dimension under a corresponding single exposure process.

7. The method of claim 1 wherein a sum of the exposure dose of each of the plurality of exposure processes is approximately equal to the optimized exposure dose.

8. The method of claim 1 wherein the exposure dose of each of the plurality of exposure processes is substantially different from each other.

9. The method of claim 1 wherein the exposure dose of each of the plurality of exposure processes is substantially same to each other.

10. An extreme ultraviolet lithography (EUVL) method, the EUVL method comprising:
- providing at least two mask areas having a same pattern, wherein at least one of the at least two mask areas includes a defect;
- forming a resist layer over a substrate;
- determining an optimized exposure dose based on an exposure dose for a pre-specified pattern on one of the at least two mask areas to achieve a pre-specified target dimension under a corresponding single exposure process; and
- forming a latent image in the resist layer using the at least two mask areas, wherein the forming a latent image includes:
  - performing at least two exposure processes on a same area of the resist layer,
  - wherein each of the at least two exposure processes uses an exposure dose that is less than the optimized exposure dose, and
  - wherein a sum of the exposure dose of each of the at least two exposure processes is approximately equal to the optimized exposure dose.

11. The EUVL method of claim 10 wherein the performing at least two exposure processes includes each of the at least two exposure processes projecting the same pattern of the at least two mask areas on the same area of the resist layer.

12. The EUVL method of claim 11 wherein the at least two mask areas are from a mask.

13. The EUVL method of claim 11 wherein the at least two mask areas are from at least two masks.

14. The EUVL method of claim 11 wherein the exposure dose of each of the at least two exposure processes is substantially same to each other.

15. The EUVL method of claim 11 wherein the exposure dose of each of the at least two exposure processes is substantially different from each other.

16. A method comprising:
- providing a first mask area;
- providing a second mask area having a same pattern as the first mask area;
- forming a resist layer over a substrate;
- determining an optimized exposure dose for the resist layer; and
- exposing a same area of the resist layer to the first mask area with a first exposure dose and to the second mask area with a second exposure dose, wherein the first exposure dose and the second exposure dose are each less than the optimized exposure dose.

17. The method of claim 16 wherein the first mask area and the second mask area are from a mask.

18. The method of claim 16 wherein the first mask area and the second mask area are from two masks.

19. The method of claim 16 wherein at least one of the first mask area and the second mask area has a defect.

20. The method of claim 16 wherein the first exposure dose is substantially different from the second exposure dose.

* * * * *